US 8,605,255 B2

(12) United States Patent
Mann et al.

(10) Patent No.: US 8,605,255 B2
(45) Date of Patent: Dec. 10, 2013

(54) IMAGING OPTICAL SYSTEM AND PROJECTION EXPOSURE SYSTEM INCLUDING THE SAME

(75) Inventors: Hans-Juergen Mann, Oberkochen (DE); Wilhelm Ulrich, Aalen (DE); Stephan Muellender, Aalen (DE); Hartmut Enkisch, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 419 days.

(21) Appl. No.: 12/767,627

(22) Filed: Apr. 26, 2010

(65) Prior Publication Data

US 2010/0265481 A1   Oct. 21, 2010

Related U.S. Application Data

(63) Continuation of application No. PCT/EP2008/008619, filed on Oct. 11, 2008.

(60) Provisional application No. 60/982,793, filed on Oct. 26, 2007.

(30) Foreign Application Priority Data

Oct. 26, 2007   (DE) .................. 10 2007 051 671

(51) Int. Cl.
*G03B 27/54* (2006.01)
*G03B 27/32* (2006.01)

(52) U.S. Cl.
USPC ............................................. 355/67; 365/77

(58) Field of Classification Search
None
See application file for complete search history.

(56) References Cited

U.S. PATENT DOCUMENTS

| 4,804,258 | A | 2/1989 | Kebo |
| 6,396,900 | B1 * | 5/2002 | Barbee et al. ................... 378/84 |
| 6,750,948 | B2 | 6/2004 | Omura |
| 6,894,834 | B2 | 5/2005 | Mann et al. |
| 7,050,152 | B2 | 5/2006 | Terashima et al. |

(Continued)

FOREIGN PATENT DOCUMENTS

| CN | 1 334 626 | 2/2002 |
| CN | 1 612 052 A | 5/2005 |

(Continued)

OTHER PUBLICATIONS

Hudyma, "An Overview of Optical Systems for 30 nm Resolution Lithography at EUV Wavelengths," Proc. of Spie, vol. 4832, Dec. 1, 2002, pp. 137-148.

(Continued)

*Primary Examiner* — Peter B Kim
*Assistant Examiner* — Michelle Iacoletti
(74) *Attorney, Agent, or Firm* — Fish & Richardson P.C.

(57) ABSTRACT

An imaging optical system has a plurality of mirrors. These image an object field in an object plane into an image field in an image plane. In the imaging optical system, the ratio of a maximum angle of incidence of imaging light on reflection surfaces of the mirrors and an image-side numerical aperture of the imaging optical system is less than 33.8°. This can result in an imaging optical system which offers good conditions for a reflective coating of the mirror, with which a low reflection loss can be achieved for imaging light when passing through the imaging optical system, in particular even at wavelengths in the EUV range of less than 10 nm.

25 Claims, 13 Drawing Sheets

(56) References Cited

U.S. PATENT DOCUMENTS

| | | |
|---|---|---|
| 7,209,286 B2 | 4/2007 | Mann et al. |
| 7,626,770 B2 | 12/2009 | Singer et al. |
| 7,682,031 B2 | 3/2010 | Mann et al. |
| 7,706,057 B2 * | 4/2010 | Van Herpen et al. ......... 359/359 |
| 2002/0056815 A1 | 5/2002 | Mann et al. |
| 2002/0154395 A1 | 10/2002 | Mann et al. |
| 2003/0021026 A1 | 1/2003 | Allan et al. |
| 2004/0057134 A1 | 3/2004 | Dinger |
| 2005/0122498 A1 | 6/2005 | Jasper |
| 2005/0173653 A1 | 8/2005 | Yamada |
| 2006/0232867 A1 | 10/2006 | Mann et al. |
| 2007/0236784 A1 | 10/2007 | Singer et al. |
| 2008/0316451 A1 | 12/2008 | Mann et al. |
| 2010/0231885 A1 | 9/2010 | Mann |
| 2010/0231886 A1 | 9/2010 | Mann |

FOREIGN PATENT DOCUMENTS

| | | |
|---|---|---|
| DE | 10 2005 042 005 | 7/2006 |
| DE | 10 2006 017 336 | 10/2007 |
| EP | 0 267 766 | 5/1988 |
| EP | 0 689 075 | 12/1995 |
| EP | 0 799 528 | 1/2001 |
| EP | 1 093 021 | 4/2001 |
| EP | 1 093 031 | 4/2001 |
| EP | 1 434 093 | 6/2004 |
| EP | 1 930 771 | 6/2008 |
| EP | 1 825 315 | 10/2008 |
| JP | 09 213618 | 8/1997 |
| JP | 2007-514192 | 5/2007 |
| WO | WO 96/19871 | 6/1996 |
| WO | WO 03/016977 | 2/2003 |
| WO | 2005/059617 | 6/2005 |
| WO | WO 2005/098506 | 10/2005 |
| WO | WO 2006/063605 | 6/2006 |
| WO | WO 2006/069725 | 7/2006 |
| WO | WO 2006/119977 | 11/2006 |
| WO | WO 2009/052932 | 4/2009 |
| WO | WO 2009/053023 | 4/2009 |

OTHER PUBLICATIONS

D.A. Tichenor et al., "EUV Engineering Test Stand", Lawrence Livermore National Laboratory, Feb. 14, 2000, Figs. 6 (preprint UCRL-JC-137668).

The Chinese Office Action, with English translation, for corresponding CN Appl No. 200880113387.4, dated Jul. 4, 2012.

Office Action in the related Japanese application, No. JP2010-530304, with English translation, 12 pages, dated Mar. 21, 2013.

English translation and Chinese Office Action from China Patent Application No. 2008 80113387.4, filed on Jan. 18, 2013.

* cited by examiner

IMAGING OPTICAL SYSTEM AND PROJECTION EXPOSURE SYSTEM INCLUDING THE SAME

CROSS-REFERENCE TO RELATED APPLICATIONS

This application is a continuation of PCT/EP2008/008619, filed on Oct. 11, 2008, which claims benefit of U.S. Provisional Application No. 60/982,793, filed on Oct. 26, 2007, and to German Application No. 10 2007 051 671.3, filed Oct. 26, 2007. The entire contents of each of the above-referenced applications is incorporated herein by reference.

FIELD OF THE INVENTION

The invention relates to an imaging optical system and to a projection exposure system including an imaging optical system, to a method for the production of a microstructured component using a projection exposure system, and to a microstructured component produced by this method.

BACKGROUND

Examples of imaging optical systems composed of mirrors are disclosed in U.S. Pat. No. 6,750,948 B2, US 2006/0232867 A1, EP 0 267 766 A2, U.S. Pat. No. 7,209,286 B2 and WO 2006/069 725 A1.

Because of a high reflection loss of the light on mirrors in such imaging optical systems, such systems can have transmission properties which cannot be tolerated when using EUV radiation, in particular with a wavelength which is less than 10 nm.

SUMMARY

In certain aspects, the invention features an imaging optical system including a plurality of mirrors in which good conditions for a reflective coating of the mirror surfaces are created, with which low reflection losses can be achieved for imaging light when passing through the imaging optical system, in particular even at wavelengths in the EUV range which are less than 10 nm.

It is believed that an imaging optical system composed of a plurality of mirrors with a very low ratio of the maximum angle of incidence and the numerical aperture leads to the possibility of providing all the reflection surfaces of the mirrors of the imaging optical system with a multi-layer coating, which has a high reflectivity at the cost of a low acceptance bandwidth for the angle of incidence. Because the angles of incidence vary only very slightly in the imaging optical system according to the invention, a multi-layer coating of this type can be used with a low acceptance bandwidth for the angle of incidence. The ratio of the minimum angle of incidence and the numerical aperture can be less than 33.0°, less than 32.5°, less than 32.0°, less than 31.5°, and even less than 30.7°.

In certain embodiments, at least one obscured mirror (i.e., a mirror having an opening for the passage of light that causes an obscuration in a pupil of the imaging optical system) facilitates the construction of the imaging optical system in terms of minimising the maximum angle of incidence for a given image-side numerical aperture.

Imaging optical systems can include six mirrors at least three of which have openings for the passage of the light that obscure a pupil of the optical imaging system. Such constructions may be particularly suitable for minimising the ratio of the maximum angle of incidence and the image-side numerical aperture.

Reflective coatings on the mirrors may allow a structural resolution which is less than 10 nm. Imaging optical systems may also have the advantages which have already been explained previously in relation to the at least one obscured mirror. With an obscured mirror of this type, a pupil obscuration, i.e., a masking of particular angle of incidence of the imaging light onto the image field, can be achieved. In some embodiments, a structural resolution of 6 nm or even a resolution of yet smaller structures can be achieved. $B_4C/CsI$ multilayers may be used as reflective coatings. Each multi-layer reflective coating may be constructed from 300 $B_4C/CsI$ bilayers. A layer thickness of the individual bilayers may increase parabolically with increasing distance of the layer from an optical axis of the imaging optical system. In this way, the reflectivity of the mirror increases for angles of incidence which deviate more strongly from the perpendicular incidence at the mirror edge.

An imaging optical system with a resolution capability better than 20 nm can allow the resolution of the finest structures. In this way, highly integrated microstructured or nanostructured components may be produced. In certain embodiments, it being preferable for an image-side numerical aperture of 0.4 at the most to be used. This can facilitate the construction of the imaging optical system.

Imaging optical systems may also include the features discussed above in combinations other than those claimed.

In one aspect, the invention features a projection exposure system for microlithography that includes an imaging optical system, a light source, and an illumination optical assembly, wherein during operation the illumination optical assembly directs light from the light source to the object field of the imaging optical system. The light source of the projection exposure system may be configured so as to be broadband and may, for example, have a bandwidth which is greater than 1 nm, greater than 10 nm or greater than 100 nm. Additionally, the projection exposure system may be configured so as to be able to be operated with light sources of different wavelengths. Light sources for other wavelengths, in particular those wavelengths used for microlithography, may also be used in combination with the imaging optical system according to the invention, for example, light sources with wavelengths of 365 nm, 248 nm, 193 nm, 157 nm, 126 nm, 109 nm and, in particular, also with wavelengths which are less than 100 nm. An appropriately adapted coating of the optical surfaces is thus used depending on the wavelength used.

In some embodiments, the light source provides light having a wavelength which is less than 10 nm. Such light may require reflective coatings on the mirrors, which have only a small acceptance bandwidth for the angle of incidence, in order to achieve acceptable reflectivity. A low acceptance bandwidth for the angle of incidence can be fulfilled using disclosed imaging optical systems.

In another aspect, the invention features a method for the production of a microstructured component that includes providing a reticle and a wafer in a projection exposure system for microlithography including an imaging optical system disclosed herein, projecting a structure on the reticle onto a light-sensitive layer support by the wafer using the system, and producing a microstructure on the wafer after projecting the structure. In a further aspect, the invention features microstructured or nanostructured components produced according to the method.

BRIEF DESCRIPTION OF THE DRAWINGS

In the following Detailed Description, embodiments are described in greater detail by means of the drawings, in which.

DETAILED DESCRIPTION

Figure 1:
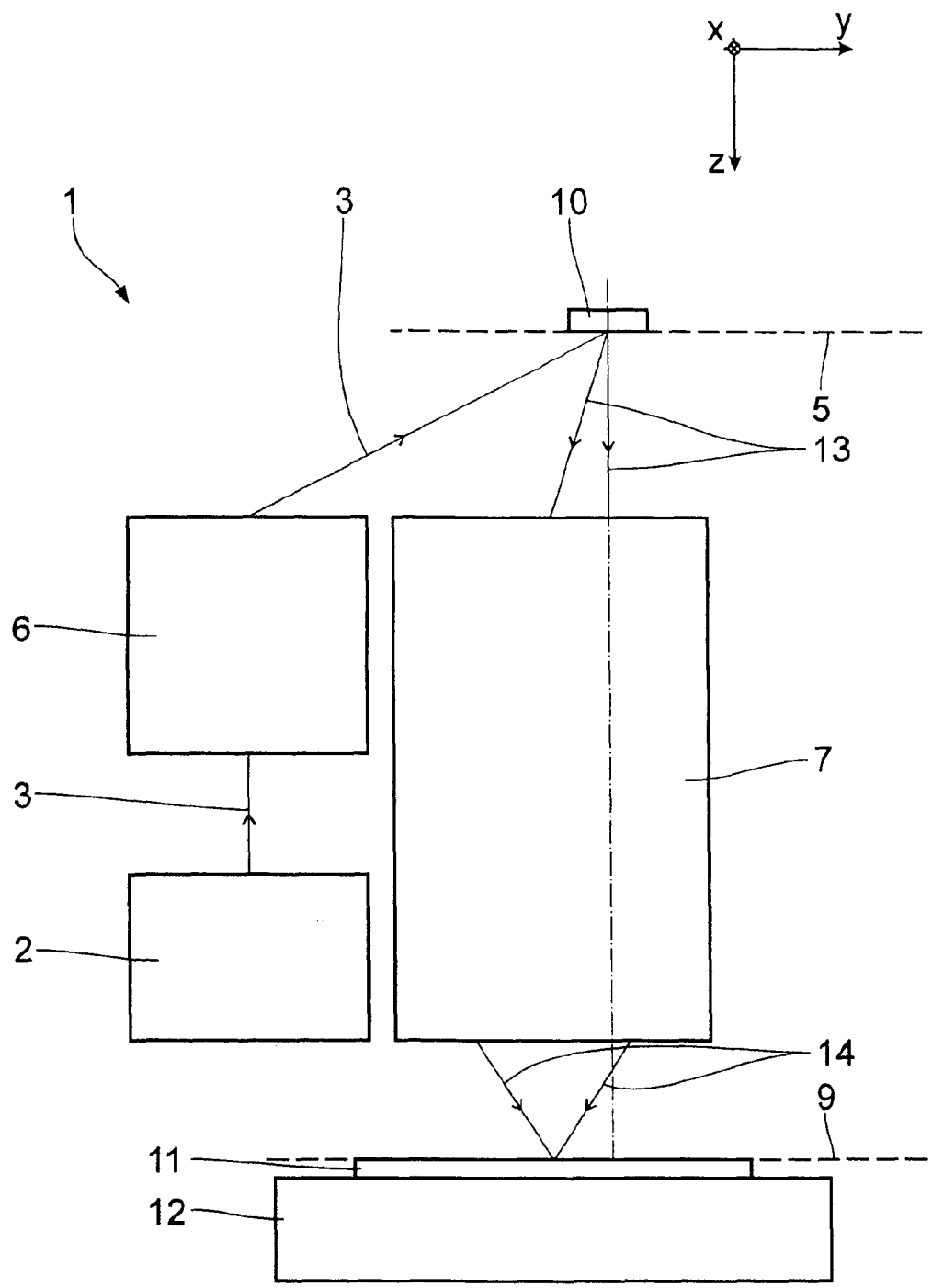
FIG. 1 is a schematic view of a projection exposure system for EUV microlithography.

Referring to FIG. 1, a projection exposure system 1 for microlithography has a light source 2 for illumination light or illumination radiation 3. The light source 2 is an EUV light source, which produces light in a wavelength range, for example, between 5 nm and 30 nm, in particular between 5 nm and 10 nm. The light source 2 may in particular be a light source with a wavelength of 6.9 nm. Other EUV wavelengths are also possible. In general, any desired wavelengths, for example visible wavelengths or even other wavelengths which may be used in microlithography and for which suitable laser light sources and/or LED light sources are available (for example 365 nm, 248 nm, 193 nm, 157 nm 129 nm, 109 nm), are possible for the illumination light 3 which is guided in the projection exposure system 1. A light path of the illumination light 3 is shown extremely schematically in FIG. 1.

An illumination optical assembly 6 guides the illumination light 3 from the light source 2 to an object field 4 (cf. FIG. 3) in an object plane 5. The object field 4 is imaged into an image field 8 (cf. FIG. 2) in an image plane 9 at a predetermined reduction scale by a projection optical system or imaging optical system 7. Embodiments shown in FIG. 2 or FIG. 9 may be used for the projection optical system 7. The projection optical system 7 according to FIG. 2 has a reduction factor of 8. Other reduction scales are also possible, for example 4×, 5×, or even reduction scales which are greater than 8×. For illumination light 3 with an EUV wavelength, an imaging scale of 8× is particularly suitable, because an object-side angle of incidence on a reflection mask 10 can thus remain small. Also, an imaging scale of 8× does not require the use of unnecessarily large masks. In the projection optical system 7 in the embodiments according to FIG. 2 and the following, the image plane 9 is arranged parallel to the object plane 5. In this way, a portion, coinciding with the object field 4, of the reflection mask 10 which is also referred to as a reticle is imaged.

The imaging performed by the projection optical system 7 takes places on the surface of a substrate 11 in the form of wafer which is supported by a substrate support 12. FIG. 1 schematically shows between the reticle 10 and the projection optical system 7 a light beam 13 of the illumination light 3 entering said projection optical system, and between the projection optical system and the substrate 11, a light beam 14 of the illumination light or imaging light 3 exiting the projection optical system 7. The numerical aperture of the projection optical 7 on the image field side is 0.40 in accordance with FIG. 2. This is not shown to scale in FIG. 1.

In order to aid the description of the projection exposure system 1 and the various embodiments of the projection optical system 7, an xyz system, which shows the respective locations of the components represented in the figures may be taken, is specified in the drawings. In FIG. 1, the x direction extends perpendicular to and into the drawing plane. The y direction extends to the right and the z direction extends downwards.

The projection exposure system 1 is a scanner-type device. Both the reticle 10 and the substrate 11 are scanned in the y direction during the operation of the projection exposure system 1. A stepper type device for the projection exposure system 1, in which a stepwise displacement of the reticle 10 and of the substrate 11 in the y direction takes place between individual exposures of the substrate 11, is also possible.

Figure 2:
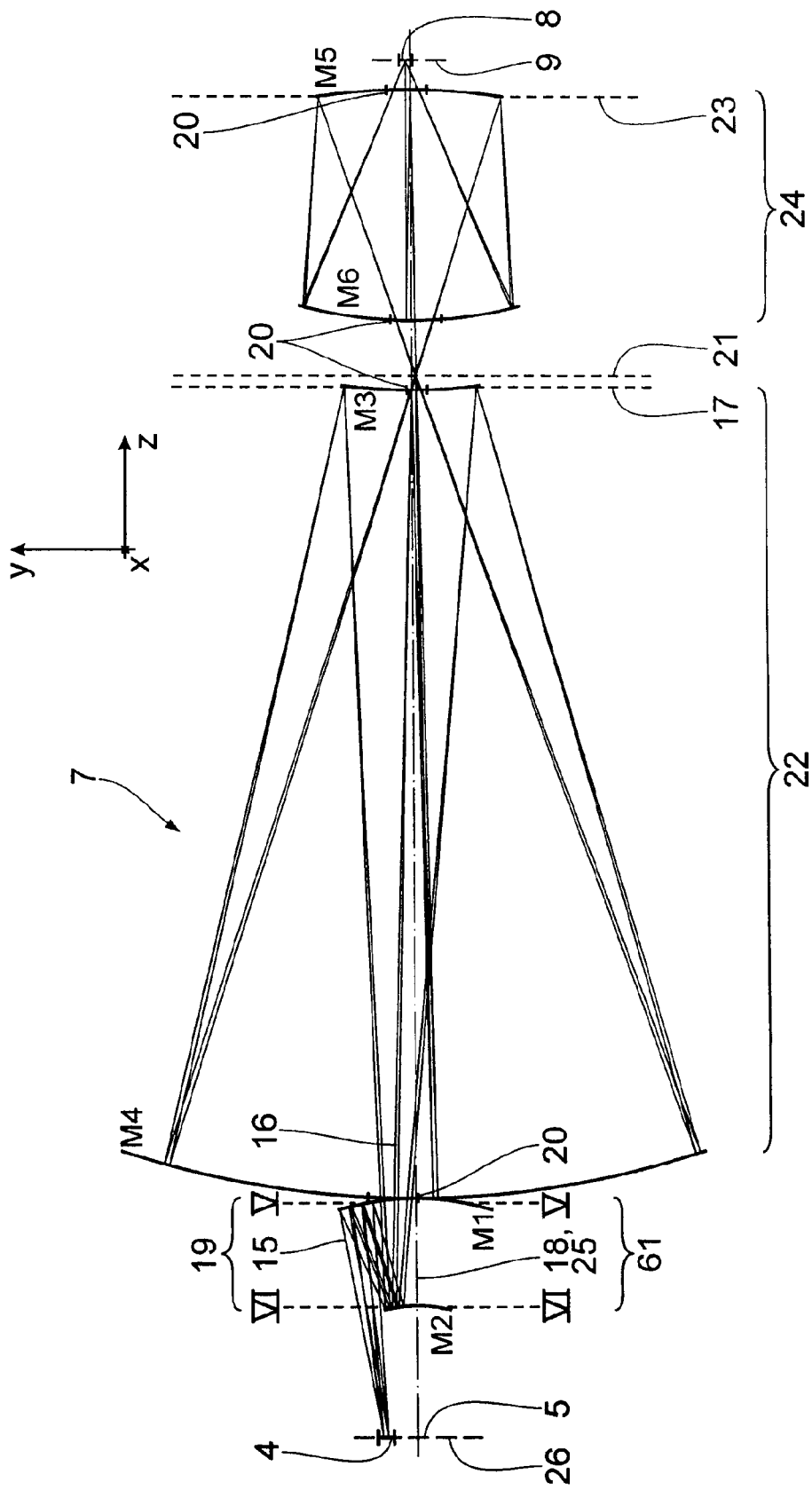
FIG. 2 is a meridional section of an embodiment of an imaging optical system of the projection exposure system.

FIG. 2 shows the optical construction of a first embodiment of the projection optical system 7. This shows the light path of each of three individual rays 15, which proceed in each case from two object field points, which are distanced from one another in the y direction in FIG. 2. The three individual rays 15, which belong to one of these two object field points, are each associated with three different illumination directions for the two object field points. Principle rays 16, which extend through the centre of a pupil in a pupil plane 17 of the projection optical system 7, are shown in FIG. 2 only for reasons of clarity, as these are not real imaging light paths of the projection optical system 7 due to the central pupil obscuration. Proceeding from the object plane 5, these principle rays 16 initially extend divergently. This is referred to in the following as a negative back focal length of an entrance pupil of the projection optical system 7. The entrance pupil of the projection optical system 7 according to FIG. 2 lies not inside the projection optical system 7, but before the object plane 5 in the light path. This makes it possible, for example, to arrange a pupil component of the illumination optical assembly 6 in the entrance pupil of the projection optical system 7 before the projection optical system 7 in the light path, without further imaging optical components having to be present between this pupil component and the object plane 5. As an alternative, a positive back focal length of the entrance pupil, or an object-side telecentric light path as a further alternative, is also possible. The second alternative is used, for example, in relation to a reflection mask as a reticle 10 in the object plane 5 with the use of a ray divider element or in conjunction with a transmission mask as a reticle in the object plane 5.

The projection optical system 7 shown in FIG. 2 has a total of six mirrors, which are numbered M1 to M6 in the sequence of the light path of the individual rays 15, starting from the object field 4. FIG. 2 shows merely the calculated reflection surfaces of the mirrors M1 to M6. In general, the mirrors M1 to M6 are larger than the reflection surfaces which are actually used.

The optical data of the projection optical system 7 according to FIG. 2 are shown below by means of two tables. In the "radius" column, the first table shows the respective radii of curvature of the mirrors M1 to M6. The third column (thickness) describes the distance in each case to the following surface in the z direction starting from the object plane 5.

The second table describes the precise surface shape of the reflection surfaces of the mirrors M1 to M6, where the constants K and A to E are to be used in the following equation for the sagittal height z:

$$z(h) == \frac{ch^2}{1 + SQRT\{1 - (1+K)c^2h^2\}} + +Ah^4 + Bh^6 + Ch^8 + Dh^{10} + Eh^{12}$$

Here, h represents the distance of the projection optical system 7 from an optical axis 18. Therefore, $h^2 = x^2 + y^2$. The reciprocal of the radius is used for c.

| Surface | Radius (1/c) | Thickness | Operating mode |
|---|---|---|---|
| Object plane | INFINITY | 348.222 | |
| M1 | −379.407 | −157.578 | REFL |
| M2 | −202.767 | 1353.319 | REFL |
| SLOT | INFINITY | 0.000 | |
| M3 | 1127.182 | −1195.630 | REFL |
| M4 | 1374.690 | 1626.377 | REFL |
| M5 | −975.061 | −330.747 | REFL |
| M6 | 681.443 | 375.745 | REFL |
| Image plane | INFINITY | 0.000 | |

| Surface | K | A | B |
|---|---|---|---|
| M1 | 0.000000E+00 | −6.780209E−11 | −1.455553E−15 |
| M2 | 0.000000E+00 | 2.307286E−09 | 2.337524E−14 |
| M3 | 0.000000E+00 | 1.500225E−09 | 1.781600E−14 |
| M4 | 0.000000E+00 | −1.573831E−12 | −8.140292E−19 |
| M5 | 0.000000E+00 | 6.446612E−10 | 2.597249E−15 |
| M6 | 0.000000E+00 | 3.799673E−10 | 1.680031E−15 |

| Surface | C | D | E |
|---|---|---|---|
| M1 | −3.423358E−21 | 0.000000E+00 | 0.000000E+00 |
| M2 | 5.367802E−18 | 0.000000E+00 | 0.000000E+00 |
| M3 | −2.232896E−19 | 0.000000E+00 | 0.000000E+00 |
| M4 | −5.798511E−26 | 0.000000E+00 | 0.000000E+00 |
| M5 | 4.409975E−20 | 1.865473E−25 | −9.721913E−32 |
| M6 | 5.791990E−21 | 0.000000E+00 | 0.000000E+00 |

The mirrors M1 and M2 of a first mirror group 19 are used in the shape of a ring segment and off-axis in relation to the optical axis 18. The used optical reflection surface of the mirrors M1 and M2 thus lies at a distance from the optical axis 18. The object field 4 and the image field 8 are arranged at a distance from the optical axis 18. The reflection surfaces of all the mirrors M1 to M6 are rotationally symmetrical about the optical axis 18 in accordance with the above equation for the sagittal height z.

The optically used regions of the mirrors M1 and M2 have no openings for the passage of imaging light that result in an obscuration in a pupil of the imaging optical system. The first mirror group 19 is thus a non-obscured mirror group. The reflection surfaces of the mirrors M1 and M2 face one another.

The mirrors M1, M4, M5 and M6 are concave mirrors. The mirrors M2 and M3 are convex mirrors.

The individual rays 15 pass through an opening 20 in the mirror M4 between the mirrors M2 and M3 in the imaging light path. The mirror M4 is used around opening 20. The mirror M4 is thus an obscured mirror, as it results in an obscuration of a pupil in the imaging optical system. As well as the mirror M4, the mirrors M3, M5 and M6 are also obscured and likewise each comprise an approximately central through-opening 20. In total, two non-obscured mirrors, namely the mirrors M1 and M2, and then four obscured mirrors, namely the mirrors M3 to M6, are thus initially present in the projection optical system 7.

The pupil plane 17 lies in the light path in the projection optical system 7 in the region of the reflection of the individual rays 15 on the mirror M3.

The mirrors M1 and M4 are arranged back-to-back as regards the orientation of the reflection surfaces thereof.

Between the mirrors M4 and M5 in the imaging light path lies an intermediate image plane 21 of the projection optical system 7. The individual rays 15 penetrate the intermediate image plane 21 directly after the individual rays 15 pass through the through-opening 20 of the mirror M3.

The mirrors M3 and M4 represent a first obscured mirror group 22 of the projection optical system 7 between the pupil plane 17 and the intermediate image plane 21, which is arranged after the non-obscured mirror group 19 in the imaging light path. The reflection surfaces of the mirrors M3 and M4 face one another.

The individual rays 15 penetrate opening 20 in the mirror M6 between the intermediate image plane 21 and the mirror M5 in the light path. A further pupil plane 23 of the projection optical system 7 is present in the region of the reflection of the individual rays 15 on the mirror M5.

The mirrors M5 and M6 represent a further obscured mirror group 24 of the projection optical system 7 between the intermediate image plane 20 and the image plane 9, which is arranged after the obscured mirror group 22. The reflection surfaces of the mirrors M5 and M6 face one another.

After the reflection of individual rays 15 on the mirror M6, the individual rays 15 pass through opening 20 in the mirror M5 and reach the image field 8. The following table shows the maximum and minimum angles of incidence for the individual rays 15 in the meridional section shown in FIG. 2. These are the respective maximum and minimum angles of incidence on the mirrors M1 to M6.

| Mirror | Max. angle of incidence (meridional section) [°] | Min. angle of incidence (meridional section) [°] |
|---|---|---|
| M1 | 7.52 | 5.87 |
| M2 | 12.35 | 9.16 |
| M3 | 10.38 | 0.81 |
| M4 | 2.35 | 0.42 |

-continued

| Mirror | Max. angle of incidence (meridional section) [°] | Min. angle of incidence (meridional section) [°] |
|---|---|---|
| M5 | 12.10 | 1.66 |
| M6 | 10.41 | 2.19 |

The ratio of the maximum angle of incidence of imaging light onto the reflection surfaces of the mirrors M1 to M6 and the numerical aperture of the projection optical system 7 is thus specified by the maximum angle of incidence onto the mirror M2, which is 12.35°. The ratio of this maximum angle of incidence and the numerical aperture is thus 30.9° in the projection optical system 7 shown in FIG. 2.

The low maximum angle of incidence provides the possibility of using a reflection surface even for low EUV wavelengths, for example in the range of 6.9 nm, which have a comparatively large acceptance bandwidth for the angle of incidence because of the low maximum angle of incidence. This is further explained below by means of FIG. 14. This acceptance bandwidth of the reflective layer for the angle of incidence increases as the maximum angle of incidence for which the reflective coating is constructed decreases. Reflective coatings which are formed as a layer stack with a large number of, in particular, successively alternating layer materials with different refractive indexes are also possible. When illumination light 3 with a wavelength of less than 10 nm is used, coatings of this type have a correspondingly low acceptance bandwidth for the angle of incidence. The projection optical system 7 can therefore be used with relatively low reflection losses by comparison with the state of the art and with smaller differences in the reflectivity of the individual mirrors over the reflection surfaces thereof even at low wavelengths of this type.

The optical axis 18 is shown as a broken line in FIG. 2. This broken line simultaneously represents the line of intersection of a principle dividing plane 25 (xz plane in FIG. 2) with the meridional plane (yz plane in FIG. 2) according to FIG. 2. This principle dividing plane 25 is perpendicular to the drawing plane in FIG. 2. The optical axis 18 lies in the principle dividing plane 25. Additionally, a normal 26 of a central object field point, lying in the meridional plane of FIG. 2, on the optical axis 18 is perpendicular to the principle dividing plane 25. This normal 26 also lies in the drawing plane of FIG. 2 and coincides with the line of intersection of the object plane 5 (xy plane in FIG. 2) with the meridional plane, i.e., the drawing plane in FIG. 2.

The imaging rays, extending in the meridional section, of the optical system do not pass through the principle dividing plane 25 in the first, non-obscured mirror group 19 of the projection optical system 7. The principle dividing plane 25 is first passed through by individual rays 15 after the reflection on the mirror M2 between the mirrors M2 and M3 in the imaging light path, i.e. at the transition between the mirror groups 19 and 22. The principle dividing plane 25 is first passed through by the principle rays 16 in the pupil plane 17.

Figure 3:
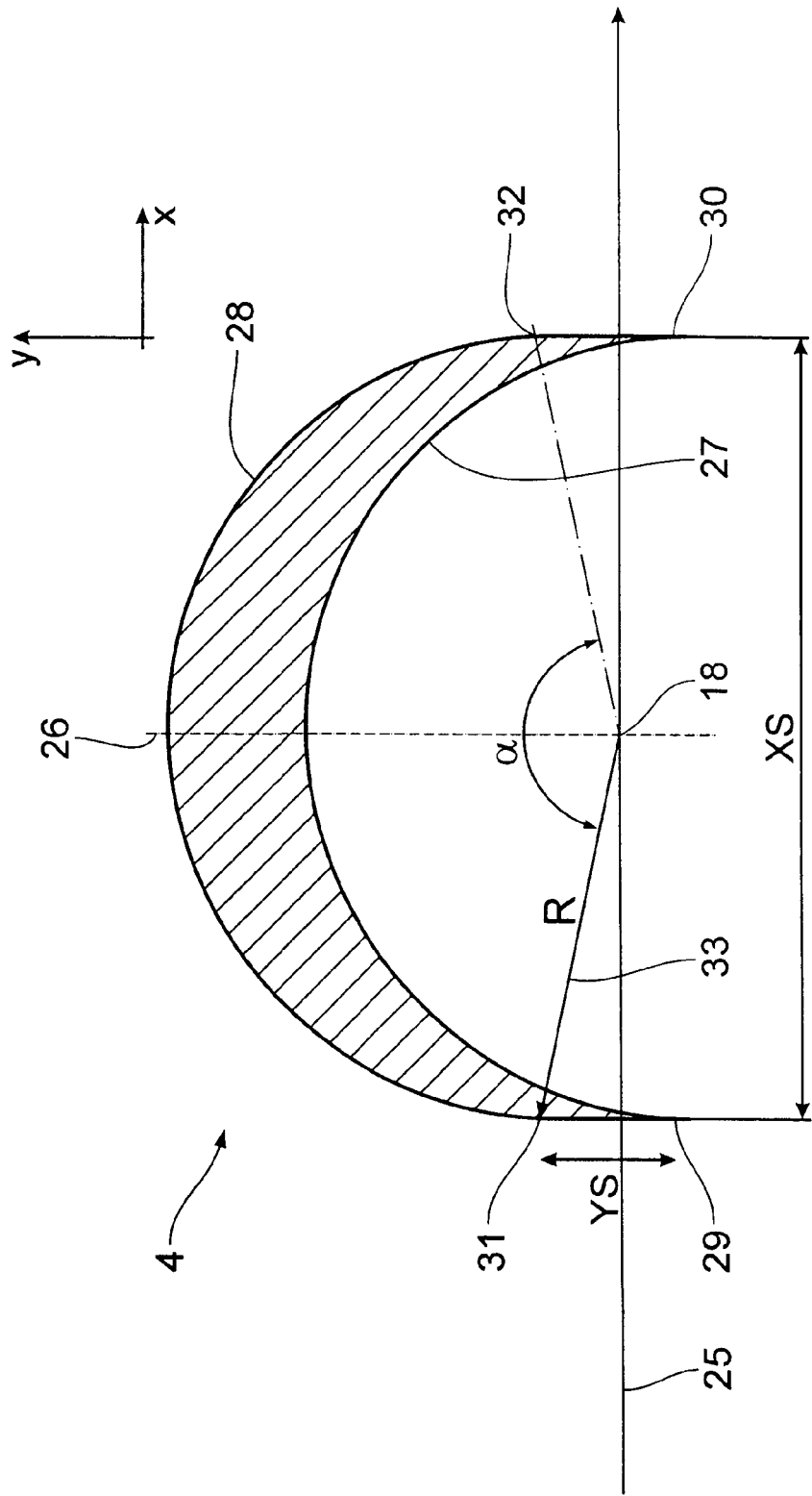
FIG. 3 is an enlarged view of an object field of the imaging optical system according to FIG. 2.

FIG. 3 is an enlarged view of the object field 4 of the projection optical system 7. The image field 8 has exactly the same shape except that it is reduced by a factor of 8. The field 4 is an arc-shaped field, which is delimited by two arcs 27, 28 of the same radius R, which are displaced parallel to one another in the y direction by a distance YS. The field 4 is also delimited by two boundary lines 29, 30 respectively connecting the two ends of the arcs 27, 28 and extending parallel to the normal 26. The two boundary lines 29, 30 are at a distance XS, the scanning slot width, from one another. The principle dividing plane 25 passes through the centres of the two boundary lines 29, 30. The optical axis 18 therefore lies precisely between the centres of the two boundary lines 29, 30. Because of this arrangement of the optical axis 18 between the boundary lines 29, 30, the field 4 is therefore a field with a minimum ring field radius R. This is given by the following expression:

$$R = \mathrm{SQRT}\left[\left(\frac{XS}{2}\right)^2 + \left(\frac{YS}{2}\right)^2\right]$$

In the projection optical system 7 shown in FIG. 2, the object field 4 has dimensions of XS=104 mm (scanning slot width) and YS=8 mm (scanning slot length). This results in a ring field radius R of 52.154 mm for the object field 4.

Between the boundary lines 29, 30 and the arc 28, which is shown at the top of FIG. 3, the field 4 has border transitions 31, 32, where the arc 28 transitions into the boundary lines 29, 30 which extend in a straight line. Between the border transition 31, 32, a field radius vector 33 covers an azimuth angle α, which is calculated using the following formula:

$$\alpha = 2 \arcsin(\tfrac{1}{2}XS/R)$$

This results in an azimuth angle α of 171.2° for the object field 4. The image field 8 has the same azimuth angle. This high azimuth angle means that the field 4 is arranged as close as possible to the optical axis 18 for a given XS extension. This facilitates an imaging error correction when imaging through the projection objective 7 between the object field 4 and the image field 8. In addition, the large azimuth angle leads to small parent diameters and to low asphericities of the mirrors M1 to M6. The parent diameter of a mirror is defined in the professional article "EUV Engineering Test Stand" by D. A. Tichenor et al., Lawrence Livermore National Laboratory, 14.02.2000, FIG. 6 (preprint UCRL-JC-137668). With the large azimuth angle, it is also possible to keep the angles of incidence on the mirrors M1 to M6 low.

Figure 4:
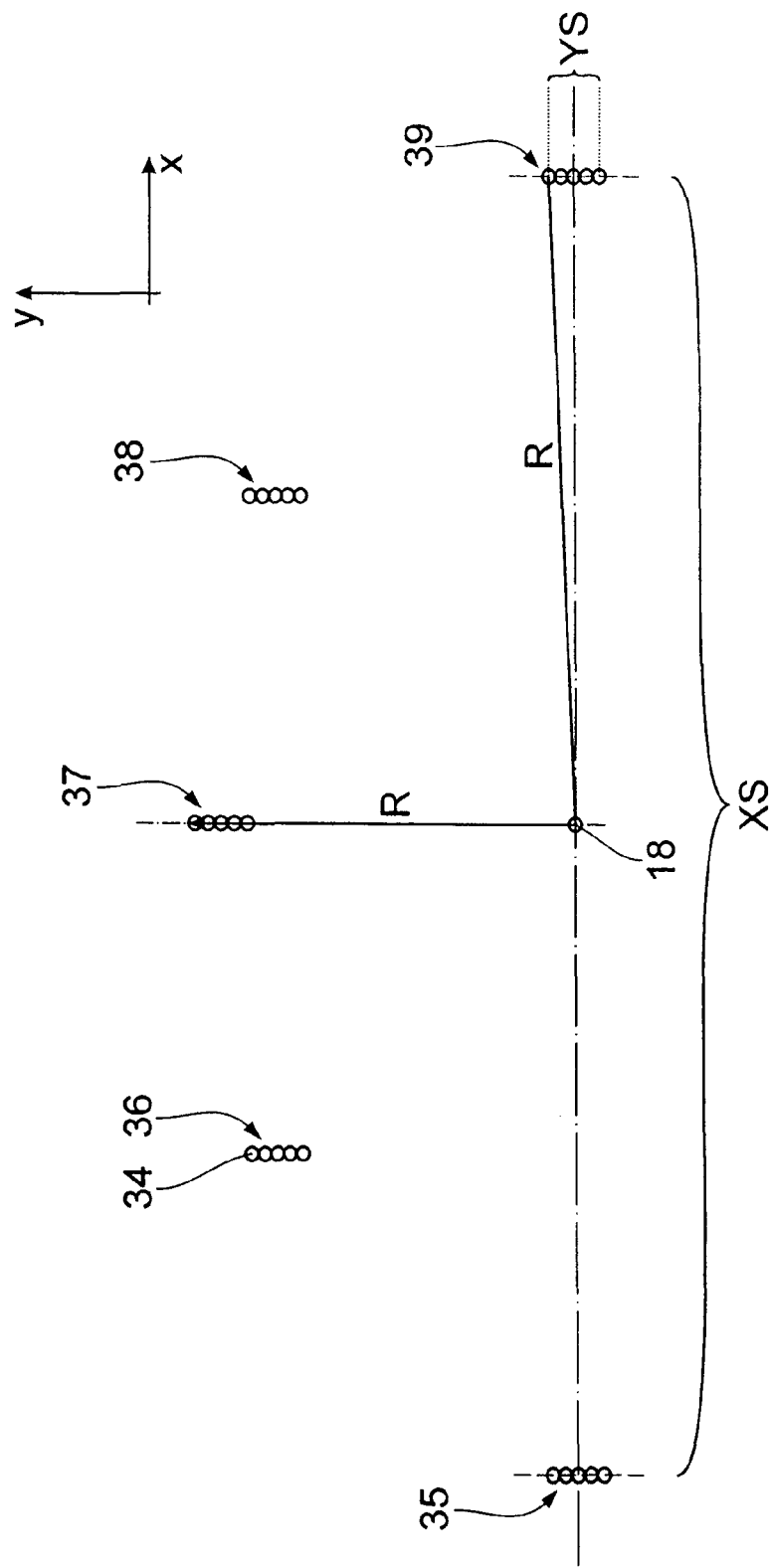
FIG. 4 is a section through imaging rays of selected field points and through an optical axis of the imaging optical system according to FIG. 2 in the region of an object plane thereof.
Figure 5:
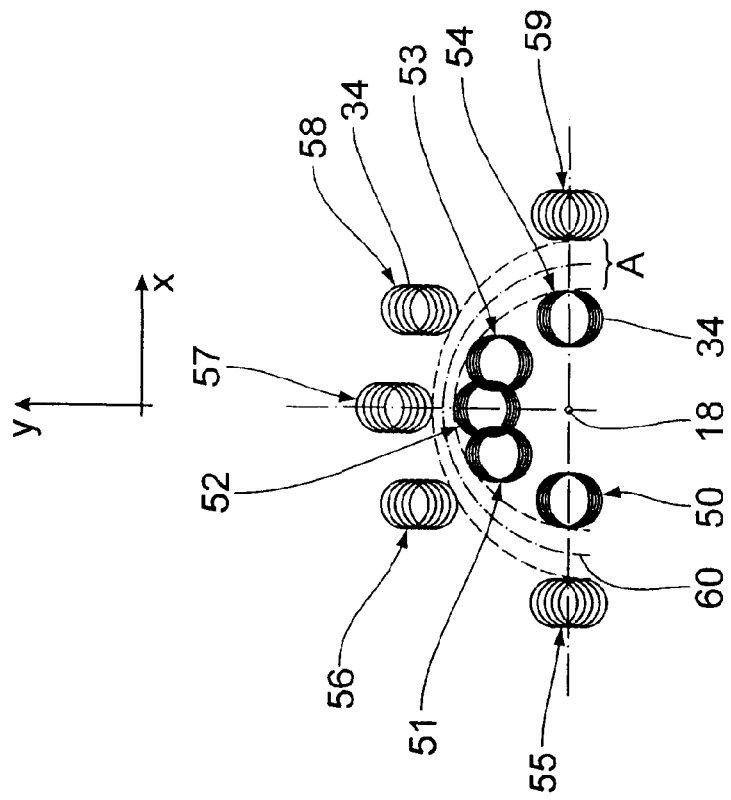
FIG. 5 is a section through the imaging rays according to FIG. 4 through a plane V-V in FIG. 2.
Figure 6:
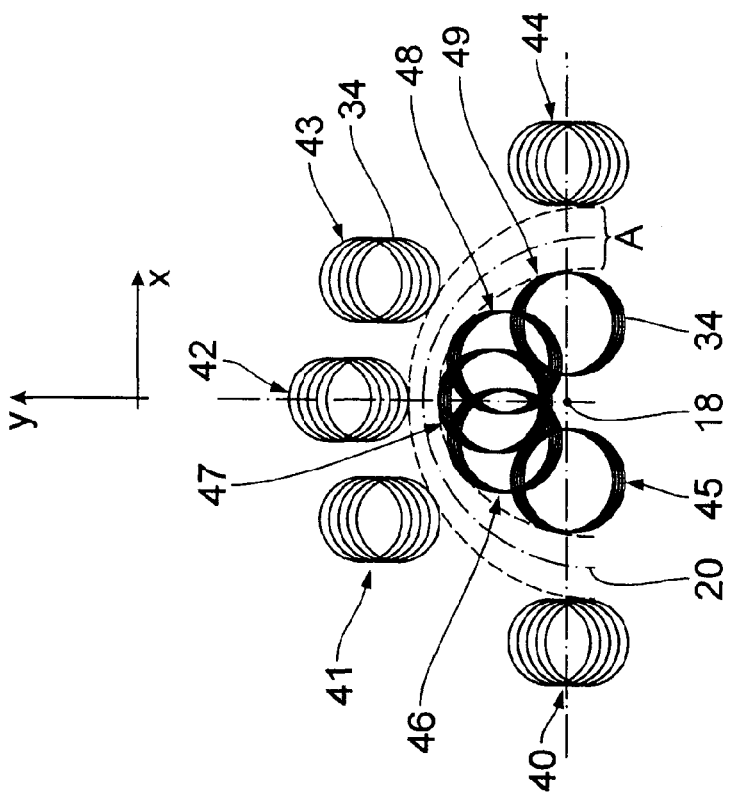
FIG. 6 is a section through the imaging rays according to FIG. 4 through a plane VI-VI in FIG. 2.

FIGS. 4 to 6 show the path of light beams 34 to selected object field points within the non-obscured mirror group 19. The light beams 34 of all light beam groups which are discussed in the following in connection with FIGS. 4 to 6 are each associated with the same 25 object field points. The light beams 34 of a total of five light beam groups 35, 36, 37, 38, 39 are shown. The light beams groups 35 to 39 are numbered from left to right in FIG. 4. Each light beam group 35 to 39 has five light beams 34 which belong to object field points with the same x value and are distanced equidistantly from one another in the y direction. The central light beam group 37 in FIG. 4 belongs to the object field points lying in the meridional plane.

FIG. 4 shows the light beams 34 in the vicinity of the object plane 5 in such a way that the shape of the arch-shaped object field 4 can be seen. The two light beam groups 35 and 39 at the edges proceed from object field points lying on the boundary lines 29, 30. The view of FIG. 4 is compressed in the y direction in such a way that the arch field radius R appears smaller in the y direction than in the x direction.

The field radius sector R, which belongs to the central light beam group 37, appears at the top in FIG. 4. In FIG. 4, the light beam groups 35 to 39 form a down-wardly open semi-circle about the optical axis 18.

FIG. 5 shows the light beams 34 in a sectional plane V of FIG. 2, i.e. in the region of the mirror M1. Light beam groups 40 to 44 reflected on the mirror M1 lie on a ring segment and form, in FIG. 5, a downwardly open external semicircle about the optical axis 18.

Furthermore, the plane V is passed through by light beam groups 45 to 49, which extend between the mirrors M2 and M3 in the light path.

The light beam groups 45 to 49 also form a semicircle, which is downwardly open in FIG. 5, about the optical axis 18. The semicircle of the light beam groups 45 to 49 thus lies between the optical axis 18 and the semicircle which is formed by the light beam groups 40 to 44.

Due to the fact that the two semicircles of the light beam groups 40 to 44 on the one hand and 45 to 49 on the other hand are each open downwardly, a sufficiently large minimal distance may be achieved between the individual light beams 34 of the light beam groups 40 to 44 on the one hand and 45 to 49 on the other hand with a compact arrangement of the light beam groups 40 to 49. This distance is denoted by A in FIG. 5. Opening 20 in the mirror M4 may thus be delimited between the light beam groups 40 to 44 on the one hand and 45 to 49 on the other hand without further steps being taken, as is shown in FIG. 5 by a dotted and dashed line. The distance A is necessary in practice because the mirrors M1 to M6 generally cannot be produced so as to be perfectly sharp-edged. The distance A also serves as a tolerance for assembling and adjusting the system. Conventionally, the distance A is a few millimetres.

FIG. 6 is a view similar to FIG. 5 of the light beams 34 to the 25 object field points in a plane VI, in the region of which the mirror M2 is arranged. Light beam groups 50, 51, 52, 53, 54 lie adjacent to the optical axis 18 at the place where the light beam 34 reflects on the mirror M2. The light beam groups 50 to 54 are arranged in a semicircle which is downwardly open in FIG. 6. This semicircle is surrounded by a likewise downwardly open semicircle of light beam groups 55 to 59, which pass through the plane VI between the object plane 5 and the mirror M1 in the imaging light path. Thus, the semicircle openings of the semicircles which are associated with the light beam groups 50 to 54 on the one hand and 55 to 59 on the other hand are also open in the same direction in the plane VI, in such a way that a distance A is provided between these light beam groups 50 to 54 on the one hand and 55 to 59 on the other hand with a compact arrangement at the same time. In this case too, a delimitation 60 at the edges of the mirror M2 is possible without vignetting the light beam groups 50 to 54 on the one hand and 55 to 59 on the other hand, as is indicated in dotted and dashed lines in FIG. 6.

Between the planes V and VI, the individual rays 15 thus pass through a multiple pass-through region 61 (cf. FIG. 2). This multiple pass-through region 61 is passed through a total of three times, in particular, on the one hand by individual rays 15 between the object plane 5 and the mirror M1, on the other hand by individual rays 15 between the mirrors M1 and M2, and also by individual rays 15 between the mirrors M2 and M3. There is no pupil plane of the projection optical system 7 in the multiple pass-through region 61. The pupil planes 17 and 23 are arranged outside the multiple pass-through region 61.

Figure 7:
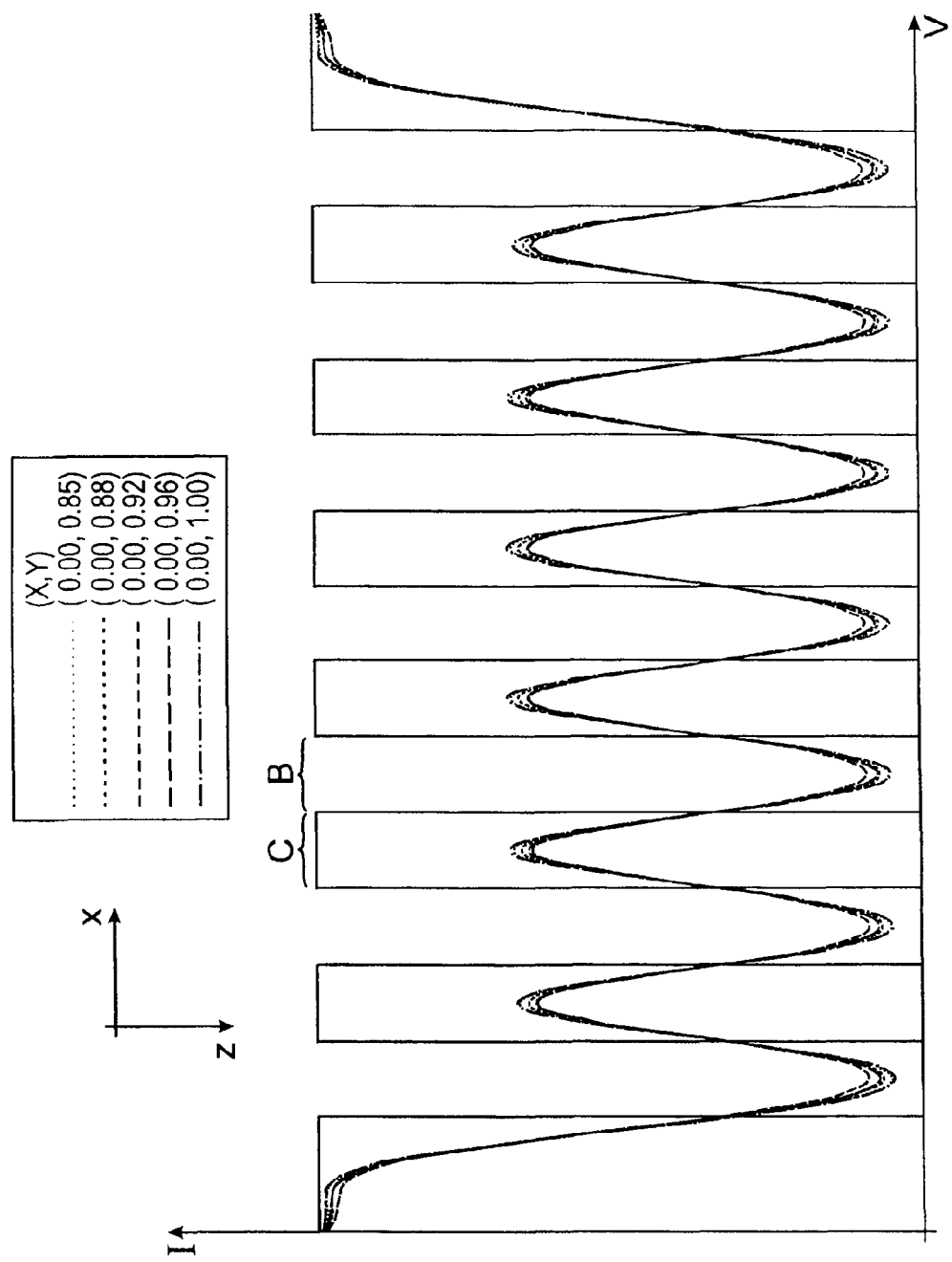
FIG. 7 shows a result of a partially coherent aerial image calculation of a structure image with the imaging optical system according to FIG. 2, in the form of a diagram which shows a relative intensity of the imaging rays as a function of a displacement in the image field of the imaging optical system.

FIG. 7 shows the result of a partially coherent aerial image calculation of the projection objective 7. A diagram is shown in which a relative intensity I is plotted upwards as a function of a position V, plotted to the right, in the image field 8. The diagram according to FIG. 7 shows the result of an imaging of a rectangular structure with a total of seven individual structures B with an image-side structure width of 10 nm and intermediate spaces C with an image-side structure distance likewise of 10 nm. The object-side structure width results from the image-side structure width via the imaging scale and in the present case is 8×10 nm=80 nm. This structure is arranged in the object field 4, i.e., on the reticle 10. The relative intensities at different y values during a scan through the image field 8 are plotted as approximately sinusoidal lines in the diagram of FIG. 7. The wavelength of the imaging light is 6.9 nm.

The relative intensities fluctuate between approximately 0.06 at the location of the 10 nm structures B and 0.62 in the centre of the 10 nm intermediate spaces C.

Due to the considerable variation in the relative intensity between the structure regions B and the structure intermediate spaces C, this 10 nm structure can be resolved in the image plane 9 without further steps being taken and can be used for the production of a corresponding structure in the image field 8 by exposure of a corresponding photoresist on the substrate 11.

Figure 8:
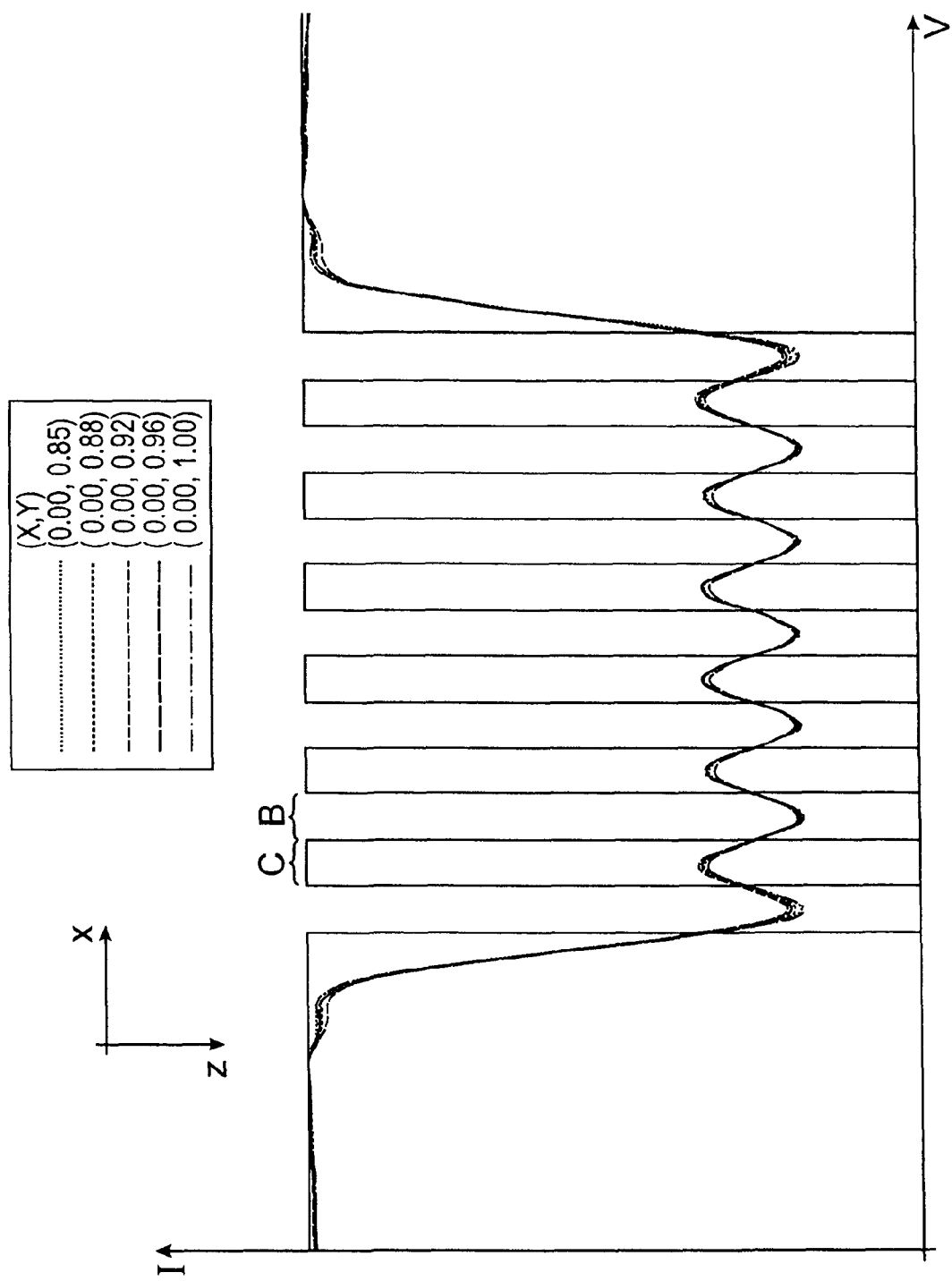
FIG. 8 is a view similar to FIG. 7 of the result of a partially coherent aerial image calculation of a structure image with a smaller structural width by comparison with FIG. 7.

FIG. 8 is a representation similar to FIG. 7 of the result of a partially coherent aerial image calculation of the projection objective 7 according to FIG. 2 in a structural resolution of structures B with structure intermediate spaces C with an extension of 6 nm in each case on the image side. A wavelength of 6.9 nm is also used in this case. In this case, the relative intensity likewise varies approximately sinusoidally from a value of approximately 0.2 in the middle of the structures B to approximately 0.37 in the centre of the intermediate space C between the structures B. Therefore, the 6 nm structures may also be imaged with sufficient intensity variation for a photoresist development.

A wavelength of 6.9 nm is also used in this case.

Figure 9:
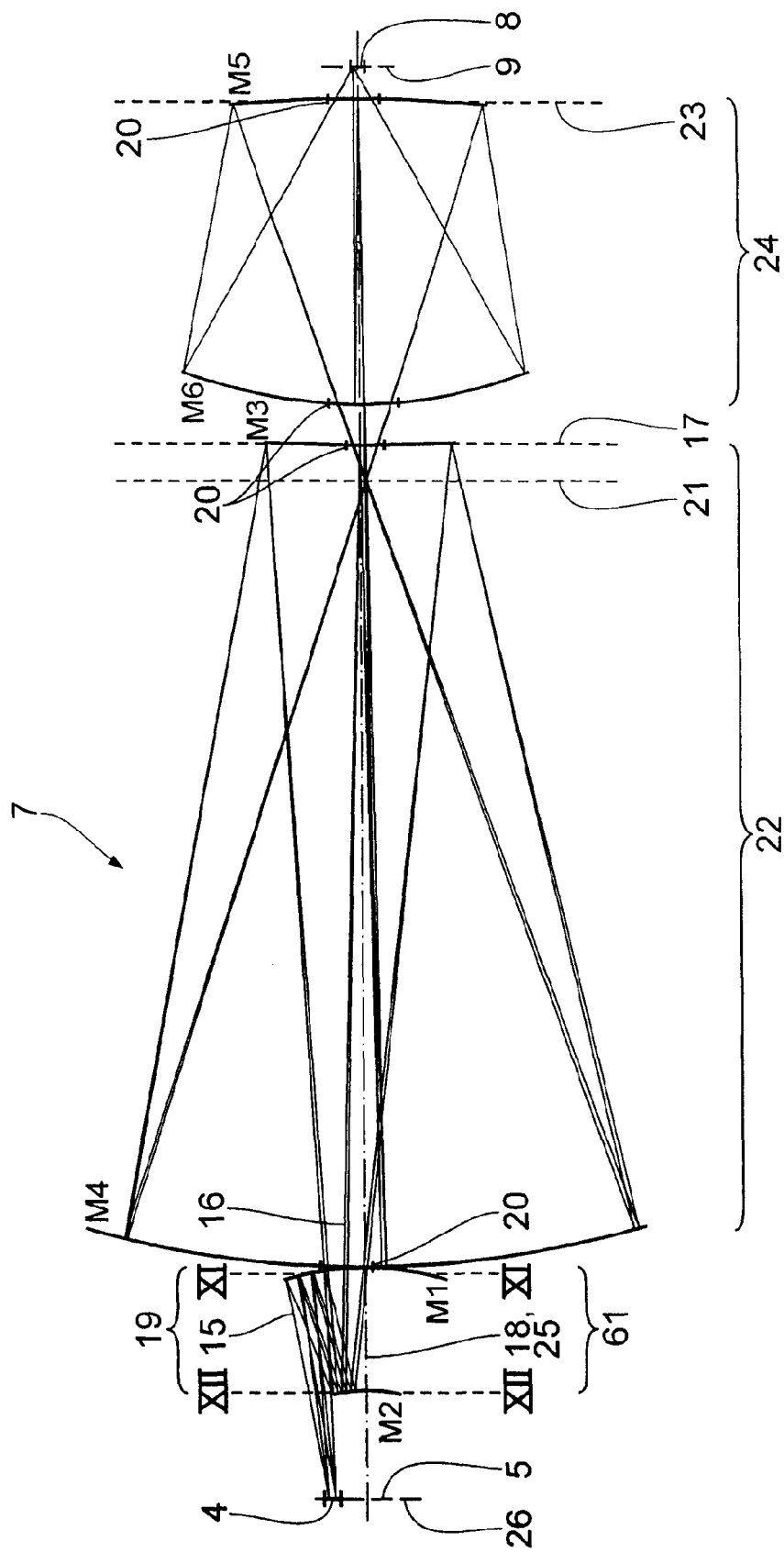
FIG. 9 is a view similar to FIG. 2 of a further embodiment of an imaging optical system for the projection exposure system according to FIG. 1.

FIG. 9 shows a further embodiment of a projection optical system 7. Components and details which correspond to those which have already been explained with reference to FIGS. 1 to 8 have the same reference numerals and will not be discussed in detail again.

The optical data of the projection optical system 7 according to FIG. 9 are reproduced in the following by means of two tables which correspond in layout to the tables for the projection optical system 7 according to FIG. 2.

| Surface | Radius (1/c) | Thickness | Operating mode |
|---|---|---|---|
| Object plane | INFINITY | 320.330 | |
| M1 | −393.803 | −170.123 | REFL |
| M2 | −208.260 | 1326.985 | REFL |
| STOP | INFINITY | 0.000 | |
| M3 | 3524.853 | −1156.745 | REFL |
| M4 | 1373.092 | 1633.832 | REFL |
| M5 | −2070.870 | −417.088 | REFL |
| M6 | 729.502 | 462.810 | REFL |
| Image plane | INFINITY | 0.000 | |

| Surface | K | A | B |
|---|---|---|---|
| M1 | 0.000000E+00 | −2.256168E−10 | −1.464839E−15 |
| M2 | 0.000000E+00 | 0.000000E+00 | 0.000000E+00 |
| M3 | 0.000000E+00 | 1.686353E−09 | 1.384199E−14 |
| M4 | 0.000000E+00 | −1.141200E−12 | −1.895182E−19 |
| M5 | 0.000000E+00 | 3.648003E−10 | 9.829850E−16 |
| M6 | 0.000000E+00 | 1.500658E−10 | 5.461440E−16 |

| Surface | C | D | E |
|---|---|---|---|
| M1 | −9.891998E−20 | 4.705529E−24 | −1.095685E−28 |
| M2 | 0.000000E+00 | 0.000000E+00 | 0.000000E+00 |

-continued

| | | | |
|---|---|---|---|
| M3 | 4.803348E−20 | 6.493470E−24 | −2.340102E−29 |
| M4 | 1.242408E−24 | −7.309532E−30 | 1.625546E−35 |
| M5 | 1.150420E−20 | −2.504098E−25 | 2.419328E−30 |
| M6 | 1.394218E−21 | 6.518915E−27 | 1.785169E−32 |

The embodiment shown in FIG. 9 has a numerical aperture of 0.50. The intermediate image plane 21 lies between the mirrors M4 and M5 in the light path, spatially in front of the mirror M3 and adjacent thereto. The mirror M2 is spherical. Otherwise, the construction of the projection optical system 7 shown in FIG. 9 corresponds to that of the projection optical system 7 according to FIG. 2.

The following table summarises the maximum angles of incidence for the individual rays 15 on the mirrors M1 to M6. The third column additionally shows the maximum deviation of the reflection surfaces of the mirrors M1 to M6 from a spherical surface which is fitted to the reflection surface with a minimum error (best fit sphere). The maximum deviation is 180 μm. Thus, the asphericities of all of the mirrors M1 to M6 of the projection optical system 7 shown in FIG. 9 are small and the mirror M2 is actually spherical, and this simplifies the construction of the reflection surfaces thereof

| Mirror | Max. angle of incidence (meridional section) [°] | Min. angle of incidence (meridional section) [°] | Max. deviation of the surfaces from a best fit sphere [μm] |
|---|---|---|---|
| M1 | 6.95 | 4.61 | 5 |
| M2 | 11.96 | 7.45 | 0 |
| M3 | 9.75 | 0.47 | 160 |
| M4 | 3.82 | 0.81 | 6 |
| M5 | 15.34 | 2.27 | 104 |
| M6 | 10.41 | 2.20 | 180 |

The ratio of the maximum angle of incidence of imaging light on the reflection surfaces of the mirrors M1 to M6 of the projection optical system 7 shown in FIG. 9, in particular the angle of incidence 15.34° on the mirror M5, and the numerical aperture of 0.5 is 30.68° in the projection optical system 7 of FIG. 9.

The total constructional length of the projection objective 7 of FIG. 9 is 2,000 mm. The maximum central pupil obscuration in the surface is less than 7 percent.

Figure 10:
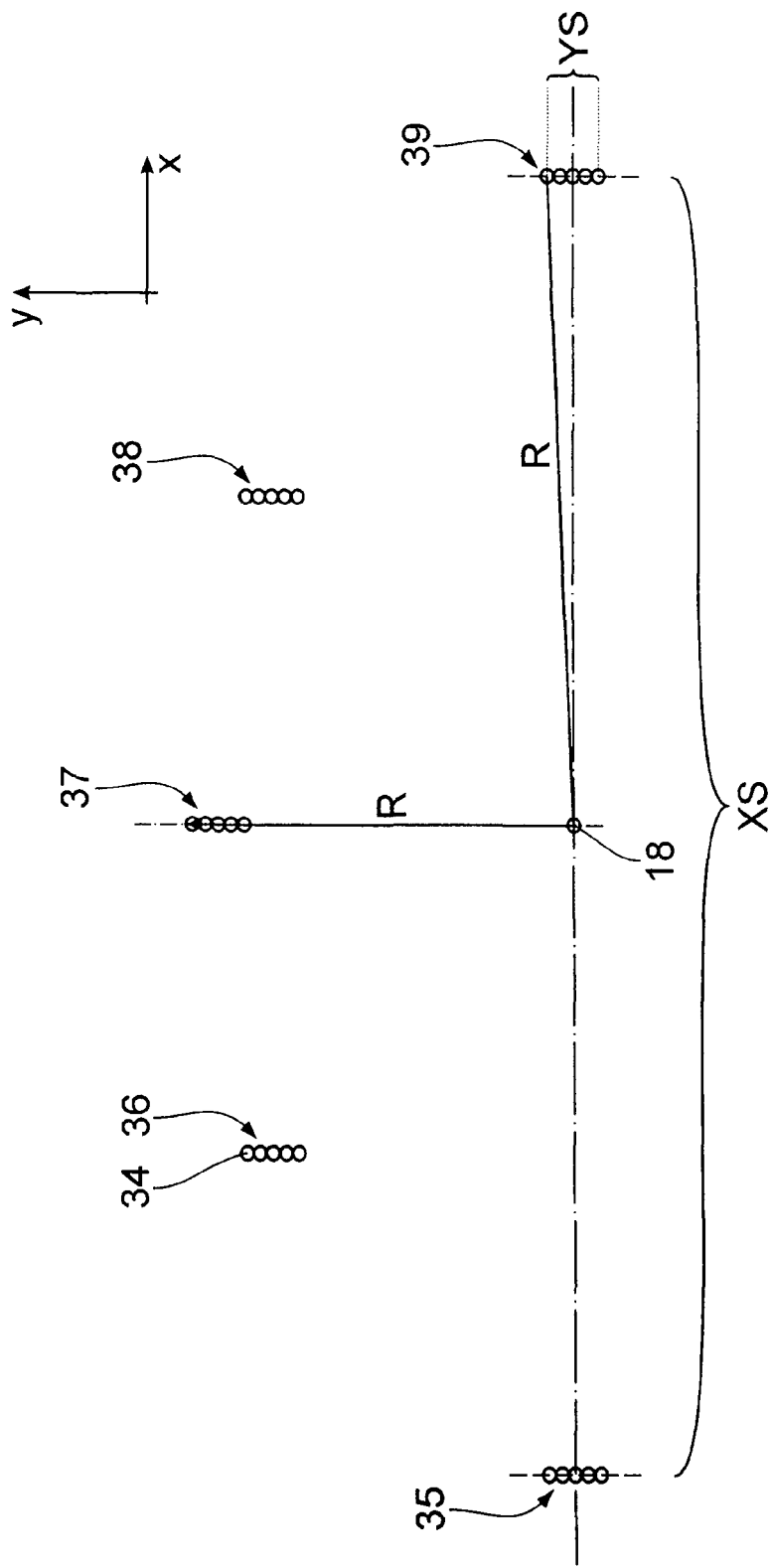
FIG. 10 is a view similar to FIG. 4 of penetration points of imaging rays of selected field points of the imaging optical system according to FIG. 9.
Figure 11:
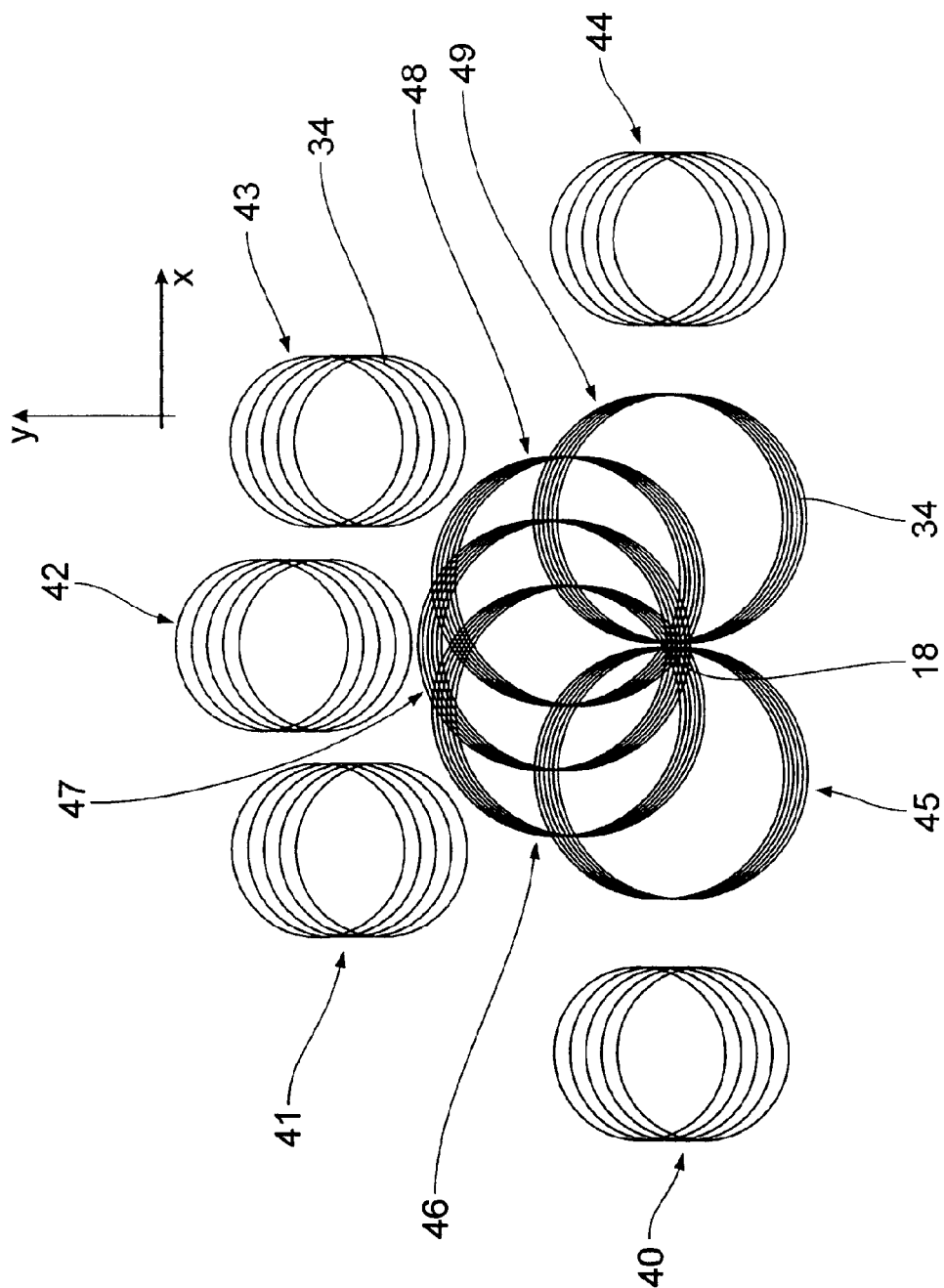
FIG. 11 is a section through the imaging rays according to FIG. 10 through a plane XI-XI in FIG. 9.
Figure 12:
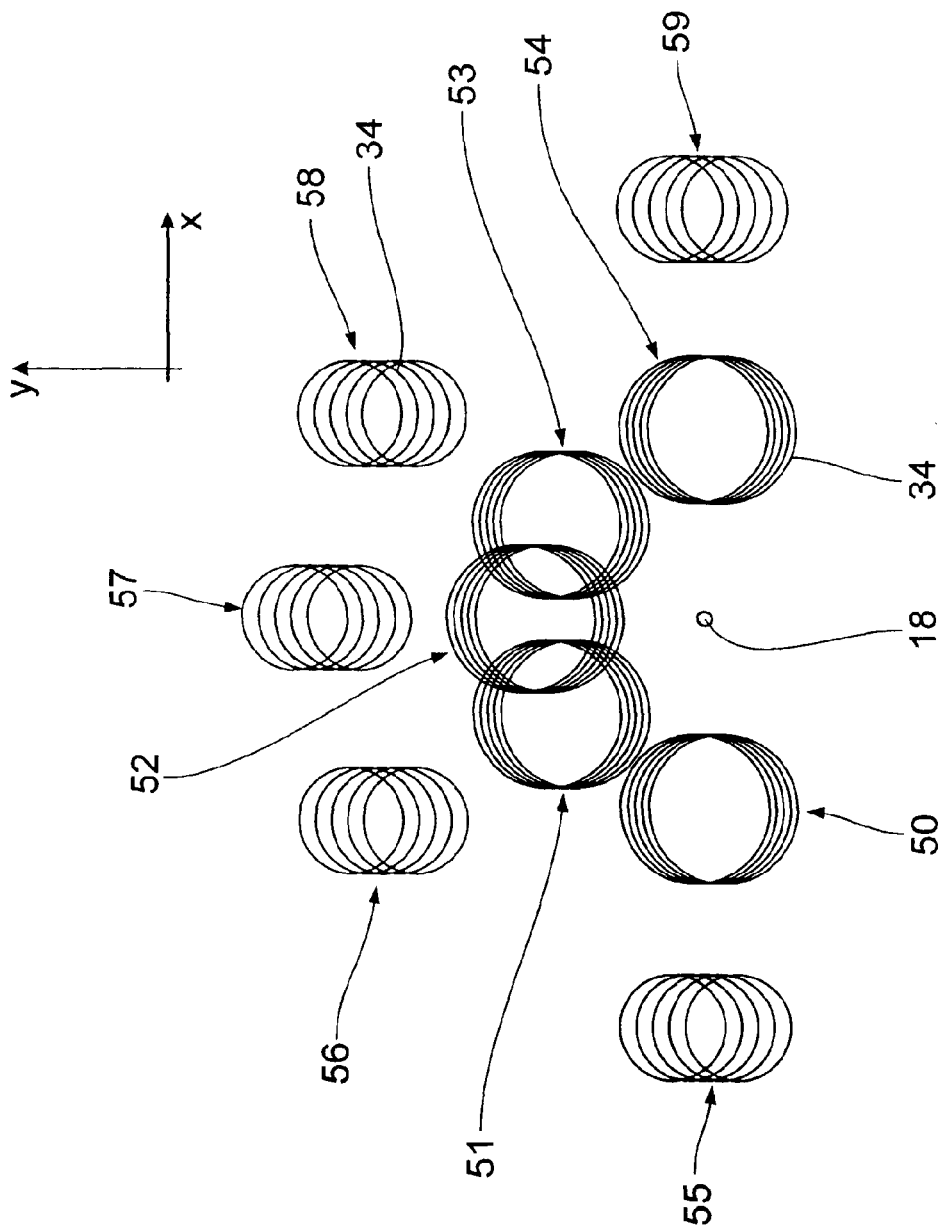
FIG. 12 is a section through the imaging rays according to FIG. 10 through a plane XII-XII in FIG. 9.

FIGS. 10 to 12 are a representation corresponding to that of FIGS. 4 to 6 of the arrangement of the light beam groups 35 to 39 in the region of the object plane 5 (FIG. 10), of the light beam groups 40 to 44 and 45 to 49 in a plane XI in the region of the mirror M1 (FIG. 11) and of the light beam groups 50 to 54 and 55 to 59 in a plane XII in the region of mirror M2 (FIG. 12). The arrangement of the light beam groups is different in the projection objectives 7 of FIG. 2 and FIG. 9 in terms of the diameters of the light beams and of the distance of the light beams from one another, but not in terms of the semicircular arrangement of the light beam groups and of the respectively identically oriented downward openings of these semicircles which are at a distance from one another.

There is no pupil plane of the projection optical system 7 in the multiple pass-through region 61 of the projection objective 7 according to FIG. 9 between the planes XI and XII, as is also the case in the projection objective 7 of FIG. 2.

In the non-obscured mirror groups, the numerical aperture is in each case slightly lower than in the obscured mirror groups.

Figure 13:
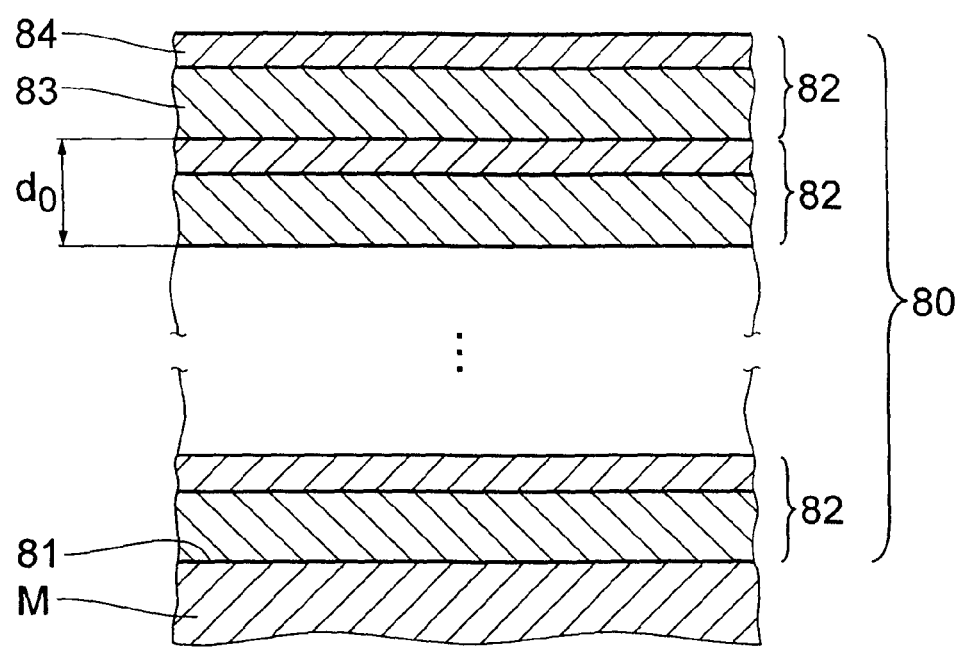
FIG. 13 is a section through a portion of one of the mirrors in the embodiments of the imaging optical system, the section being made perpendicularly through a reflective coating of a reflection surface of the mirror.

FIG. 13 is a schematic section through a portion of one of the mirrors M1 to M6 of the previously disclosed embodiments of the projection optical system 7 according to the invention. Since all of the mirrors M1 to M6 of the previously disclosed embodiments in principle have similarly constructed reflection surfaces in terms of the sequence of layers, it is sufficient to show this layer construction by means of FIG. 13 for one of these mirrors, which is referred to in the following as mirror M. The section according to FIG. 13 is made perpendicular to the reflection surface of the mirror M.

In projection optical system 7 shown in FIG. 2, a reflective coating 80 is constructed on a substrate surface 81 of the mirror M from a total of 300 bilayers 82, of which the two upper bilayers and the bilayer which is applied directly to the substrate surface are shown in FIG. 13. In the intermediate space, which is broken up in FIG. 13, between the represented bilayers 82, the remaining bilayers, which are not shown, are arranged.

Each bilayer 82 has a layer thickness $d_0$ of 3.5 nm. Each bilayer 82 has a layer of boron carbide ($B_4C$) with a layer thickness of 2.1 nm which acts as a spacer 83. Furthermore, each bilayer 82 has an absorber layer 84 of caesium iodide (CsI) with a layer thickness of 1.4 nm. The reflective coating 80 has these layer thicknesses along the optical axis 18. The layer thickness of the reflective coating 80 varies over the reflection surface of the mirror M, as will be explained in the following.

Layer data, specifically the wavelength-dependent refractive indices n and the extinction coefficients k of the layers 83, 84, as well as the coefficients characterising the layer thickness distribution d(r) of the reflective coating 80, are summarised in the two following tables:

| | Wavelength [nm] | | | | |
|---|---|---|---|---|---|
| | 6.8 | 6.9 | 7.0 | 7.1 | 7.2 |
| B4C (n) | 0.99710128 | 0.99591714 | 0.99503712 | 0.99431133 | 0.99368046 |
| B4C (k) | 0.00055386 | 0.00058077 | 0.00060834 | 0.00063680 | 0.00066696 |
| CsI (n) | 0.98456682 | 0.98382320 | 0.98305499 | 0.98224658 | 0.98139078 |
| CsI (k) | 0.00149566 | 0.00155002 | 0.00161212 | 0.00168633 | 0.00178452 |

| Layer thickness distribution | | |
|---|---|---|
| Coefficient | C0 | C2 |
| M1 | 0.9991 | 0.000E+00 |
| M2 | 1.0100 | 0.000E+00 |
| M3 | 0.9937 | 1.450E−06 |
| M4 | 0.9940 | 0.000E+00 |
| M5 | 0.9940 | 1.098E−06 |
| M6 | 0.9940 | 6.300E−07 |

The layer thickness distribution of the reflective coating 80 is thus described by the equation $$d(r) = d_0 \cdot (C0 + C2 \cdot r^2)$$

d(r) gives the local layer thickness of a bilayer 82 of the reflective coating 80, i.e., of the layer stack, as a function of the radial distance of the respectively considered local point on the reflection surface of the mirror M from the optical axis 18. The layer thickness of the reflective coating 80 therefore has a parabolic distribution for C2≠0, the layer thickness increasing with increasing distance from the optical axis for C2>0.

The ratio of the layer thicknesses of the spacer layer 83 to the absorber layer 84 within each of the bilayers 82 remains constant, irrespective of the distance r from the optical axis 18. This ratio is:

$$\gamma = d(\text{absorber layer})/d(\text{bilayer}) = 0.4$$

In this case, d represents the layer thickness of the respective layer.

With the reflective coatings 80 according to the table above, the mirrors M1 to M6 have an average mirror reflectivity of 58% for a wavelength of 6.9 nm of the illumination light 3. The resulting overall reflectivity of the projection optical system 7 is therefore 3.92%. Thus, after reflection on all of the mirrors M1 to M6 of the projection optical system 7 shown in FIG. 2, 3.92% of the intensity of the illumination light 3 proceeding from the object field 4 reaches the image field 8.

The mirrors M1 to M6 of the projection optical system 7 shown in FIG. 9 may carry a corresponding multilayer reflective coating, such as was explained previously for the embodiment shown in FIG. 2. The coefficients C0 and C2 for describing the parabolic layer thickness distribution are then adjusted to the distribution of the angle of incidence over the mirrors M1 to M6.

Figure 14:
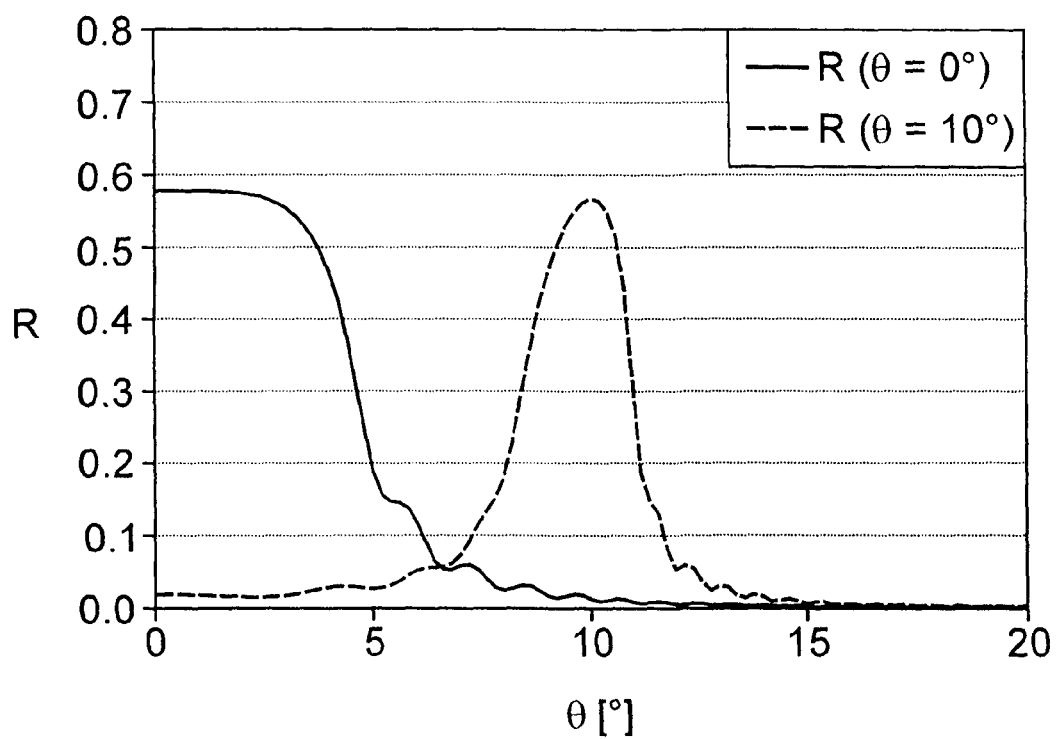
FIG. 14 is a diagram which shows the reflectivity of reflective coatings of the type according to FIG. 13 as a function of the angle of incidence of imaging light on the reflection surface of the mirrors for two reflective coatings optimized for different angles of incidence.

FIG. 14 shows the reflectivity of the reflective coating 80 in dependence on the angle of incidence for two reflective coatings 80 which are optimized for different angles of incidence, in particular for 0° (continuous line) and for 10° (broken line). It can clearly be seen that the acceptance bandwidth for the angle of incidence is considerably higher for the reflective surface 80, which is optimized for an angle of incidence of 0°, than for the reflective coating which is optimized for an angle of incidence of 10°. This acceptance bandwidth for the angle of incidence decrease monotonically with the angle of incidence for which the reflection surface 80 is optimized. The smaller the maximum angle of incidence on one of the mirrors M1 to M6, the smaller the angle of incidence for which the reflective coating 80 can be optimized and the greater the acceptance bandwidth for the angle of incidence of the reflective coating 80 which may then be used for this mirror M1 to M6.

What is claimed is:

1. An imaging optical system which during operation directs light along a path from an object plane to an image plane to image an object field in the object plane into an image field in the image plane, the imaging optical system comprising:
a plurality of mirrors arranged to direct the light along the path,
wherein:
the imaging optical system is a catoptric imaging optical system,
among all mirrors of the imaging optical system which are arranged to direct the light along the path, there are only two mirrors without an opening that intersects the path,
for each mirror of the plurality of mirrors, the light is incident on a mirror surface of the mirror at over a range of incident angles including a maximum angle of incidence, and
a ratio of the maximum angle of incidence to an image-side numerical aperture of the optical imaging system is less than 33.8°.

2. The imaging optical system of claim 1, wherein the plurality of mirrors includes at least one mirror having an opening for passage of the light, where the opening obscures a pupil of the imaging optical system.

3. The imaging optical system of claim 2, wherein the plurality of mirrors comprises six mirrors including at least three mirrors that have openings for the passage of the light that obscure a pupil of the optical imaging system.

4. The imaging optical system of claim 2, wherein the plurality of mirrors comprises six mirrors and exactly four of the plurality of mirrors have openings for the passage of the light that obscure a pupil of the imaging optical system.

5. The imaging optical system of claim 1, wherein the plurality of mirrors includes at least one mirror having an opening for passage of the light, the opening obscures a pupil of the imaging optical system, and each of the mirrors carries a reflective coating for light with a wavelength which is less than 10 nm.

6. The imaging optical system of claim 1, wherein each of the mirrors carries a reflective coating for the light, and each of the mirrors has an average reflectivity greater than 50% for the light at a wavelength which is less the 10 nm.

7. The imaging optical system of claim 6, wherein the mirrors have an average reflectivity greater than 58% for the light with a wavelength of 6.9 nm.

8. The imaging optical of claim 1, wherein, for light having a wavelength which is less than 10 nm, the imaging optical system resolves structures in the image field having a dimension of 20 nm or less, and the imaging optical system is a catoptric imaging optical system for a projection exposure system for microlithography.

9. The imaging optical system of claim 8, wherein the imaging optical system resolves structures in the image field having a dimension of 16 nm or less.

10. The imaging optical system of claim 8, wherein the imaging optical system resolves structures in the image field having a dimension of 11 nm or less.

11. The imaging optical system of claim 8, wherein the imaging optical system resolves structures in the image field having a dimension of 8 nm or less.

12. The imaging optical system of claim 8, wherein the imaging optical system resolves structures in the image field having a dimension of 6 nm or less.

13. The imaging optical system of claim 1, wherein the imaging optical system has an image side numerical aperture of 0.5 or less and resolves structures in the image field having a dimension of 20 nm or less, and the imaging optical system is a catoptric imaging optical system for a projection exposure system for microlithography.

14. The imaging optical system of claim 13, wherein the imaging optical system resolves structures in the image field having a dimension of 16 nm or less.

15. The imaging optical system of claim 13, wherein the imaging optical system resolves structures in the image field having a dimension of 11 nm or less.

16. The imaging optical system of claim 13, wherein the imaging optical system resolves structures in the image field having a dimension of 8 nm or less.

17. The imaging optical system of claim 13, wherein the imaging optical system resolves structures in the image field having a dimension of 6 nm or less.

18. A system, comprising:
the imaging optical system of claim 1;
a light source; and
an illumination optical assembly;
wherein during operation the illumination optical assembly direct light from the light source to the object field of the imaging optical system and the system is a projection exposure system for microlithography.

19. The system of claim 18, wherein the light from the light source has a wavelength which is less than 10 nm.

20. A method for the production of a microstructured component, the method comprising:
providing a reticle and a wafer in a system;
projecting a structure on the reticle onto a light-sensitive layer support by the wafer using the system; and
producing a microstructure on the wafer after projecting the structure,
wherein the system comprises:
the imaging optical system of claim 1; and
an illumination optical assembly, and
wherein during operation the illumination optical assembly directs light from a light source to the object field of the imaging optical system.

21. The imaging optical system of claim 1, wherein at least one of the plurality of mirrors comprises a coating which comprises boron carbide.

22. The imaging optical system of claim 1, wherein at least one of the plurality of mirrors comprises a coating which comprises a plurality of $B_4C/CsI$ bilayers.

23. The imaging optical system of claim 22, wherein a thickness of an individual bilayer increases parabolically with increasing distance of the bilayer from an optical axis of the imaging optical system.

24. An imaging optical system which during operation directs light along a path from an object plane to an image plane to image an object field in the object plane into an image field in the image plane, the imaging optical system comprising:
a plurality of mirrors arranged to direct the light along the path,
wherein:
wherein at least one of the plurality of mirrors comprises a coating which comprises a plurality of $B_4C/CsI$ bilayers,
the imaging optical system is a catoptric imaging optical system,
for each mirror of the plurality of mirrors, the light is incident on a mirror surface of the mirror at over a range of incident angles including a maximum angle of incidence, and
a ratio of the maximum angle of incidence to an image-side numerical aperture of the optical imaging system is less than 33.8°.

25. The imaging optical system of claim 24, wherein a thickness of an individual bilayer increases parabolically with increasing distance of the bilayer from an optical axis of the imaging optical system.

* * * * *

UNITED STATES PATENT AND TRADEMARK OFFICE
CERTIFICATE OF CORRECTION

| | |
|---|---|
| PATENT NO. | : 8,605,255 B2 |
| APPLICATION NO. | : 12/767627 |
| DATED | : December 10, 2013 |
| INVENTOR(S) | : Hans-Juergen Mann |

It is certified that error appears in the above-identified patent and that said Letters Patent is hereby corrected as shown below:

On the Title Page, Item (57) Col. 2 (Abstract), line 4, delete "light)" and insert -- light --.

In the Specification

Col. 8, line 64, delete "down-wardly" and insert -- downwardly --.

Col. 11, line 24 (approx.), delete "thereof" and insert -- thereof. --.

In the Claims

Col. 14, line 38, in Claim 8, delete "optical" and insert -- optical system --.

Signed and Sealed this
Eighteenth Day of March, 2014

Michelle K. Lee
*Deputy Director of the United States Patent and Trademark Office*